(12) United States Patent
Boloorian

(10) Patent No.: US 6,895,231 B2
(45) Date of Patent: May 17, 2005

(54) METHOD AND APPARATUS FOR ADJUSTING REFERENCE FREQUENCY IN RECEIVER AND STORAGE MEDIUM STORING CONTROL PROGRAM THEREFOR

(75) Inventor: Majid Boloorian, Kirkland, WA (US)

(73) Assignee: NEC Corporation, Tokyo (JP)

( * ) Notice: Subject to any disclaimer, the term of this patent is extended or adjusted under 35 U.S.C. 154(b) by 582 days.

(21) Appl. No.: 09/956,692

(22) Filed: Sep. 20, 2001

(65) Prior Publication Data

US 2002/0081989 A1 Jun. 27, 2002

(30) Foreign Application Priority Data

Sep. 20, 2000 (GB) .............................................. 0023118

(51) Int. Cl.[7] .............................................. H04B 15/00
(52) U.S. Cl. ........................ 455/313; 455/323; 455/517
(58) Field of Search ................................ 455/313, 323, 455/517, 550.1; 375/343, 368, 130, 134, 137, 326

(56) References Cited

U.S. PATENT DOCUMENTS 5,276,706 A    1/1994    Critchlow

FOREIGN PATENT DOCUMENTS

WO    WO 99/66649    12/1999

*Primary Examiner*—Melur Ramakrishnaiah
(74) *Attorney, Agent, or Firm*—Scully, Scott, Murphy & Presser

(57) ABSTRACT

A method and apparatus provided for adjusting reference frequency iteratively in a receiver. Received data is correlated with a locally stored synchronization code and the peak correlation value is detected. In a first run-through this will be stored in a local peak correlation store. The frequency is then adjusted by a predetermined step and the process performed again, with the peak correlation value detected being compared with the peak in the local store. If the new peak is larger then that frequency step is saved and a further frequency step applied. If the new correlation peak is smaller than the previously stored peak then the frequency step applied to derive that new peak is removed and a smaller frequency step applied. This process continues for a succession of decreasing frequency steps until all the stored frequency steps have been used up, at which point the local oscillator frequency is adjusted and the receiver continues with the cell search process.

4 Claims, 6 Drawing Sheets

METHOD AND APPARATUS FOR ADJUSTING REFERENCE FREQUENCY IN RECEIVER AND STORAGE MEDIUM STORING CONTROL PROGRAM THEREFOR

BACKGROUND OF THE INVENTION

1. Field of the Invention

The present invention relates to a method and apparatus for adjusting reference frequency in receiver and storage medium storing control program therefor so as to remove reference oscillator frequency offset in a telecommunications receiver and, in particular, in a mobile telephone receiver operating in a cellular transmission system.

2. Description of the Related Art

In cellular communication systems, the timing and frequency accuracy of transmissions from network base stations rely on very stable and highly accurate reference oscillators. As there are a fixed and relatively small number of network base stations in a system such as universal mobile telecommunications system (UMTS), or any other mobile phone system, the reference oscillators and the network base stations can be relatively expensive and accurate. An accuracy of e.g., 0.05 parts per million (ppm) is typical and more accurate oscillators are available. In such systems, however, there are typically far more mobile stations which communicate with the network base stations. In a system such as UMTS, these are mobile telephones which have to be sold at a competitive market price and therefore costs have to be minimized. Therefore, low cost reference oscillators such as voltage control crystal oscillators (VCXO) would usually be selected for the reference oscillators of mobile stations. The frequency accuracy of these low cost reference oscillators is relatively low, e.g., 5 ppm.

Because the accuracy of the mobile oscillators is much less than that available to the base stations with their more accurate reference oscillators, significant problems can occur with synchronization between the base station transmission and the locally generated carrier frequency used for down conversion.

SUMMARY OF THE INVENTION

In view of the above, it is an object of the present invention to provide a method and apparatus for adjusting reference frequency in a receiver and storage medium storing control program therefor, specifically a method and apparatus for removing reference frequency offset of a local oscillator in a telecommunications receiver and storage medium storing control program therefor.

According to a first aspect of the present invention, there is provided a method for adjusting reference frequency in a receiver wherein received signals include a plurality of sequential slots of data, at least one of which includes synchronization data, the method including the steps of down-converting received signals using a first frequency derived from a local oscillator, performing a correlation of down-converted signal with the locally stored synchronization code, detecting a peak correlation value from the result of the correlation, comparing the peak correlation value with the contents of a peak correlation value store, and adjusting the frequency applied to the down-converting in dependence on the results of the comparison, wherein further correlations and further frequency adjustments are repeatedly performed to adjust the reference frequency also in dependence on the results of the comparison.

In the foregoing, a preferable mode is one wherein the frequency adjustments comprise predetermined frequency steps and adjustments continue to be applied if the peak correlation value detected is larger than the contents of the peak correlation value store.

Also, a preferable mode is one wherein further including the step of removing the last made frequency adjustment if it results in a smaller peak correlation value than is in the peak correlation value store.

Also, a preferable mode is one wherein further including the step of subsequently applying a smaller frequency adjustment and performing further correlations and frequency adjustments with this step if it results in a larger peak correlation value than the contents of the peak correlation value store.

Also, a preferable mode is one wherein further smaller frequency adjustments are applied in response to a peak correlation value being detected which is smaller than is in the peak correlation value store after removal of the previous frequency adjustment.

According to a second aspect of the present invention, there is provided an apparatus for adjusting reference frequency in a receiver wherein received signals include a plurality of sequential slots of data, at least one of which includes synchronization data, the apparatus including means for down-converting received signals using a first frequency derived from a local oscillator, means for performing a correlation of the down-converted data with the locally stored synchronization code, means for detecting a peak correlation value, means for comparing the peak correlation value with the contents of a peak correlation value store, means for adjusting the frequency applied to the down-converting in dependence on the result of the comparison, means for performing further correlations and further frequency adjustments also in dependence on the result of the comparison.

In the foregoing, a preferable mode is one wherein the frequency adjustments applied by the means for adjusting the frequency comprise predetermined frequency steps and adjustments continue to be applied so long as the peak correlation value detected is larger than the content of the peak correlation value store.

Also, a preferable mode is one wherein the means for adjusting the frequency applied to the down-converter comprises means for removing the last made frequency adjustment if it resulted in a smaller peak correlation value than is stored in the peak correlation value store.

Also, a preferable mode is one wherein the means for adjusting the frequency applies a smaller frequency adjustment and performs further correlations and frequency adjustments with this step if it results in a larger peak correlation value than is stored in the peak correlation value store.

Also, a preferable mode is one wherein the means for adjusting the frequency applies further smaller frequency adjustments in response to a peak correlation value being detected which is smaller than is in the peak correlation value store after removal of the previous frequency adjustment.

According to a third aspect of the present invention, there is provided a storage medium storing a control program to cause a computer to carry out a method for adjusting reference frequency in a receiver wherein received signals include a plurality of sequential slots of data, at least one of which includes synchronization data, said method including a step of down-converting received signals using a first frequency derived from a local oscillator, a step of performing a correlation of the down-converted signal with the locally stored synchronization code; a step of detecting a peak correlation value, a step of comparing the peak correlation value with the contents of a peak correlation value store, a step of adjusting the frequency applied to the down-converting in dependence on the results of the comparison, and a step of performing further correlations and further frequency adjustment also in dependence on the results of the comparison.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

The problems discussed above and the solution provided by embodiments of the invention is described with reference to UMTS. It is, however, not limited to this transmission standard and can be applied to any WCDMA systems.

In UMTS, base stations which transmit and receive signals to mobile stations are asynchronous. Transmissions from the base stations need to be synchronized locally by mobiles which receive them. This is performed in an initial cell search when a mobile unit has power applied to it.

UMTS transmissions comprise a sequence of frames. Each of these has, e.g., 15 slots and contained within each of these is information dependent on the data rate to be used. Each slot contains a number of symbols where each symbol comprises 2 bits. These 2 bits can be used to transmit 4 possible states using quadrature phase shift keying. Therefore, a 10-symbol slot comprises 20 bits.

Figure 2:
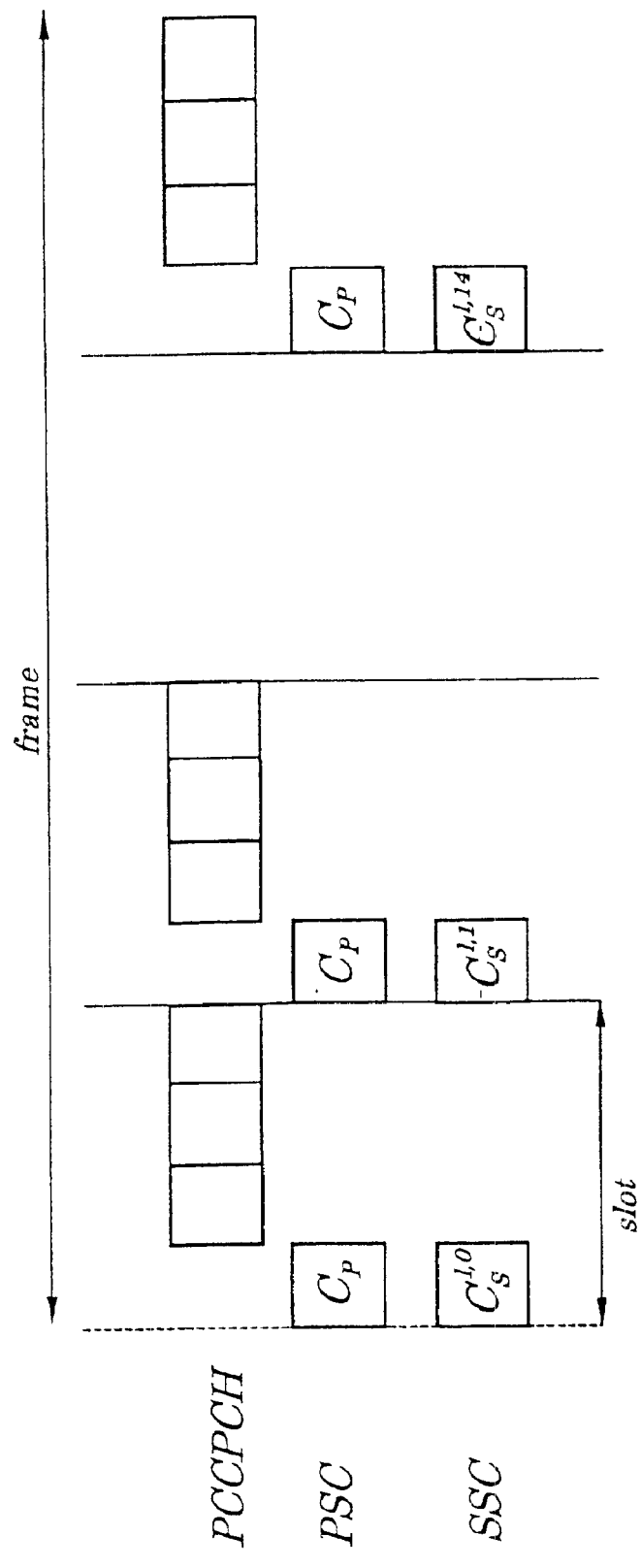
FIG. 2 illustrates the composition of base station transmissions.

Base station transmissions include a synchronization channel (SCH) which is aligned with a slot boundary and a primary common control physical channel (PCCPCH). There are 10 symbol slots in these channels The synchronization channel comprises a primary synchronization code (PSC) and a secondary synchronization code (SSC) as illustrated in FIG. 2. These are used in the initial cell search.

Figure 1:
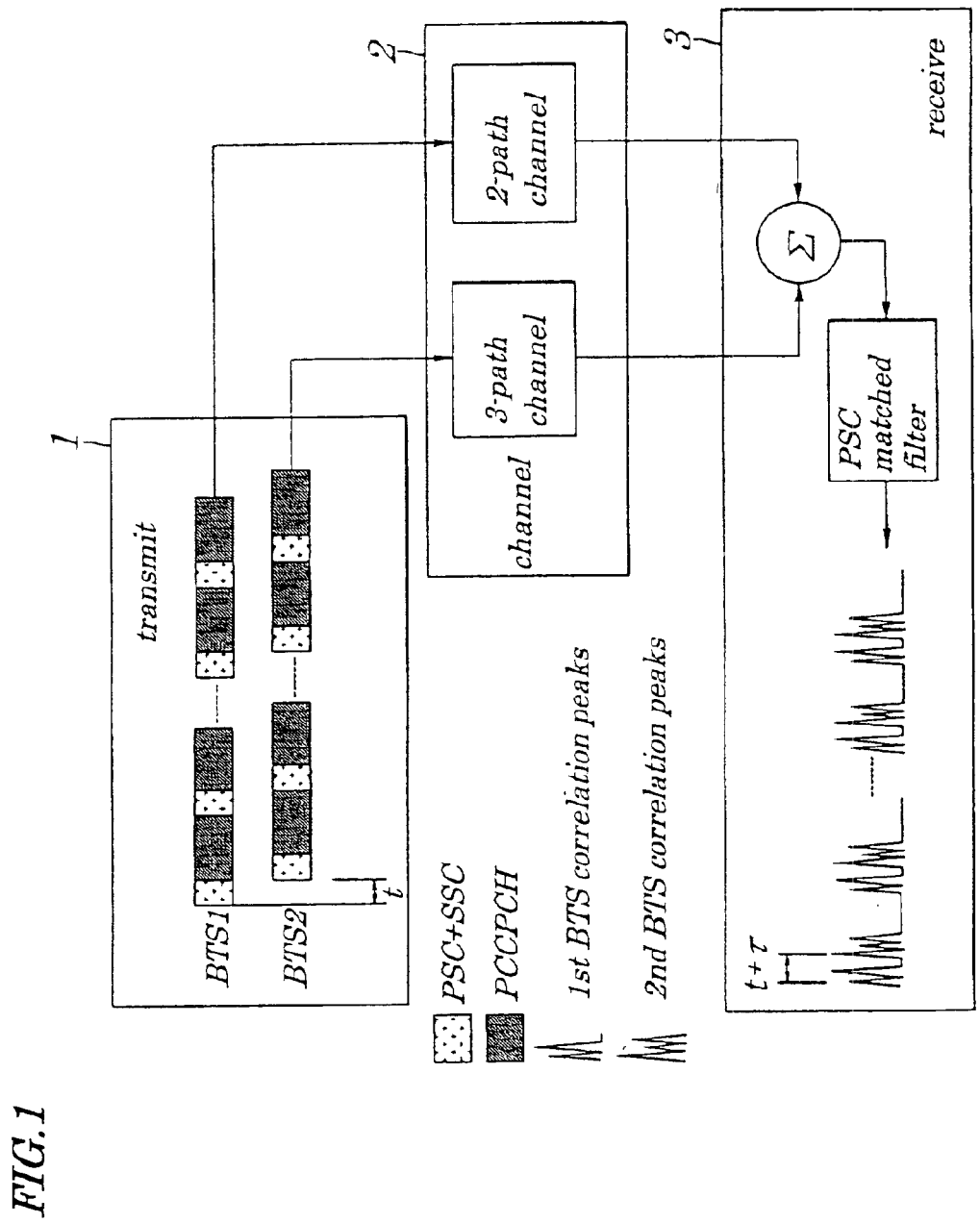
FIG. 1 is a schematic illustration of base station transmissions to a receiver.

Initial cell search by a mobile station is performed in three steps. The first of these is the acquisition of slot synchronization to the transmissions of the base station providing the strongest signal at the receiver of a mobile station. FIG. 1 illustrates schematically base station broadcast transmissions which are represented at 1, a transmission channel at 2, and a mobile station receiver at 3. In this example, transmissions from two base stations (BTS1 and BTS2) are shown.

The base station transmissions are not synchronized with each other and transmit frames comprising slots and symbols as described above. The time intervals for slots and frames are fixed.

In FIG. 1, the start of a slot for the transmissions from BTS2 is shown to be delayed from the start of a slot for transmissions from BTS1 by an arbitrary amount t seconds.

The transmissions from the base stations BTS1 and BTS2 to the receiver 3 will be affected by channel 2. Transmissions from BTS2 are illustrated as being received through a 3-path (multipath) channel while the transmissions of BTS1 are illustrated as being received through a 2-path channel. The effect of the channel 2 is to pass the signals from BTS1 and BTS2 to the receiver 3 where they are summed. Correlation of the received signal by the mobile receiver with the expected primary synchronization code stored in the receiver then provides a number of correlation peaks. The highest peak detected corresponds to the base station of the network to which the receiver will synchronize.

Correlation is performed on one slot and the results are held in a buffer. The results for a number of slots are added in. Noise and interference should be reduced and correlation will be the peak if any are detected.

The second step of the initial cell search establishes frame synchronization and identifies the code group of the base station found in step 1. The third step of the initial cell search determines the scrambling code assigned to the found base station. Further details of these second and third steps are not pertinent to the present invention and are therefore not discussed further here but will be known to those skilled in the art.

In down conversion at a mobile receiver the exact frequency to which the received signal is down-converted may not be exactly the same as that at the transmitter because of inaccuracies in the local oscillator which arises because, as described above, it is lower in cost than that used at the base station. If there is a frequency offsets then the height of correlation peak will be reduced. If the offset is significant then the correlation peak may get buried in the noise and interference therefore making it impossible to synchronize to the slot boundaries.

The performance of the UMTS cell search when operating in the FDD (Frequency Division Duplex) mode can be degraded by offsets in the carrier and sampling clock frequencies $f_c$ and $f_{smp}$. These are both derived from the frequency of a reference oscillator $f_x$ in the mobile unit.

When inaccuracies in the reference frequency are translated into inaccuracies in the carrier and sampling frequencies, the same inaccuracy will be applied to all three frequencies. For example, a desired carrier frequency of 2 GHz in a sampling clock frequency of 15.36 MHz with an inaccuracy of 1 ppm in reference frequency, represents an offset of 2 KHz in the carrier frequency and 15.36 Hz in the sampling frequency.

As far as wideband code division multiple access (WCDMA) cell search is concerned, the carrier frequency offsets result in a continuous phase variation of the received complex signal whilst an offset in the sampling clock frequency may cause incorrect detection of vital system timing. The effect of the latter is observed after processing a large number of time slots, thereby making the sampling clock frequency offsets of secondary importance.

Phase rotation caused by the offsets in the carrier frequency results in a decrease in the received signal to noise plus interference ratio and consequently to an increase in the probability of false detection of timing instances (slot boundaries). Large values of carrier frequency offset can result in large reductions in the received signal power. The sharp reduction in the probability of success of the UMTS cell search process is amongst the negative effects of the large carrier frequency offsets.

In particular, sampling clock offsets may cause slot boundaries to be detected in the wrong place. If the error in locating the slot boundaries is larger than one chip period (1/3.8 µs), the results obtained by the remaining cell search steps will also be in error. However, for practical frequency inaccuracies, the one chip error caused by the sampling clock inaccuracies is observed over long time intervals. Consequently, these inaccuracies are of secondary importance compared to the offsets in the carrier frequency. We have appreciated that the effects of these may be observed immediately and can be used to offset the referencing frequency nearer to its desired value. The consequent reduction in the inaccuracy of the reference frequency will also reduce the offsets in the carrier and sampling clock frequencies.

Preferred embodiments of the present invention provide a method and apparatus for removal of carrier frequency offsets by iterative stepping of the IF/RF local oscillators and frequency.

The invention is defined with more precision in the appended claims to which reference should now be made.

The implementation of the invention described herein is applicable to the initial cell search performed at a mobile station operating in frequency division duplex (FDD) mode in a UMTS network. The performance of the UMTS cell search can be degraded by offsets in the carrier and sampling clock frequencies. In practice, both the carrier and sampling clock frequencies are derived from the frequency of a reference oscillator (usually a VCXO). The carrier ($f_c$) and the sampling clock frequencies ($f_{smp}$) may be expressed as in equations (1) and (2) respectively. The terms $k_1$ and $k_2$ in these equations represent constants and $f_x$ is the reference frequency supplied by the reference oscillator of the mobile station.

$$f_c = k_1 \times f_x \tag{1}$$

$$f_{smp} = k_2 \times f_x \tag{2}$$

Equations (1) and (2) indicate the ways in which inaccuracies in the reference frequency generated by the crystal oscillator translate into the inaccuracies in the carrier and sampling clock frequencies. When expressed in parts per million, the same inaccuracy will apply to each of the three frequencies, $f_x$, $f_c$ and $f_{smp}$. For example, for a desired carrier frequency of 2 GHz, and a sampling clock frequency of 15.36 MHz, an inaccuracy of 1 ppm (in $f_x$) represents offsets of 2 kHz in the carrier frequency and 15.36 Hz in the sampling frequency.

A complex baseband signal transmitted by a base station may be represented as $$S_t = A(t) e^{j\theta(t)}$$

where $A(t)$ and $\theta(t)$ represent the magnitude and phase respectively of the signal. The transmitted signal when received via a fading path can be represented as:

$$S_r = \beta(t) S_t e^{j(\Delta\omega t + \phi(t) + \sigma(t))} \tag{3}$$

where $\Delta\omega$ is the carrier frequency offset in radians per second, $\phi(t)$ is the random phase (in radians) due to the Doppler shift and $\sigma(t)$ is the random phase due to noise and interference. Variations of the signal envelope are represented as $\beta(t)$.

In the first step of the UMTS cell search, the in phase (I) and quadrature (Q) components of the received signal are correlated with the primary synchronization code. When the local primary synchronization code is aligned with the first symbol of a received PCCPCH+SCH time-slot (i.e. at the slot boundary), the transmitted signal may be expressed as:

$$S_t = M e^{j\frac{\pi}{4}} \tag{4}$$

where M is a constant. The correlation of the corresponding received signal with the local primary synchronization code stored in the receiver is shown in equation (5), where T is the correlation period.

$$C = \int_0^T \left[ \beta(t) M^2 e^{j\frac{\pi}{4}} e^{j(\Delta\omega t + \phi(t) + \sigma(t))} \right] dt \tag{5}$$

Equation (5) represents the correlation between the local primary synchronization code and the received signal at the slot boundaries. As the primary synchronization code is a known signal, the carrier frequency offset may be estimated by measuring the change in the phase of the received primary synchronization code. Ignoring the effect Doppler and noise plus interference for simplicity, equation 5 may be reduced to $$C = \int_0^T M^2 e^{j\frac{\pi}{4}} e^{j(\Delta\omega t)} dt \tag{6}$$

The correlation peak is then found by finding the power of the above integral. When the received and locally generated PSC's are aligned we can put $M^2=1$ and then the following relationship expresses the correlation power:

$$|C|^2 \propto \left[ T \times \frac{\sin\left(\frac{\Delta\omega \cdot T}{2}\right)}{\frac{\Delta\omega \cdot T}{2}} \right]^2 \tag{7}$$

Figure 3:
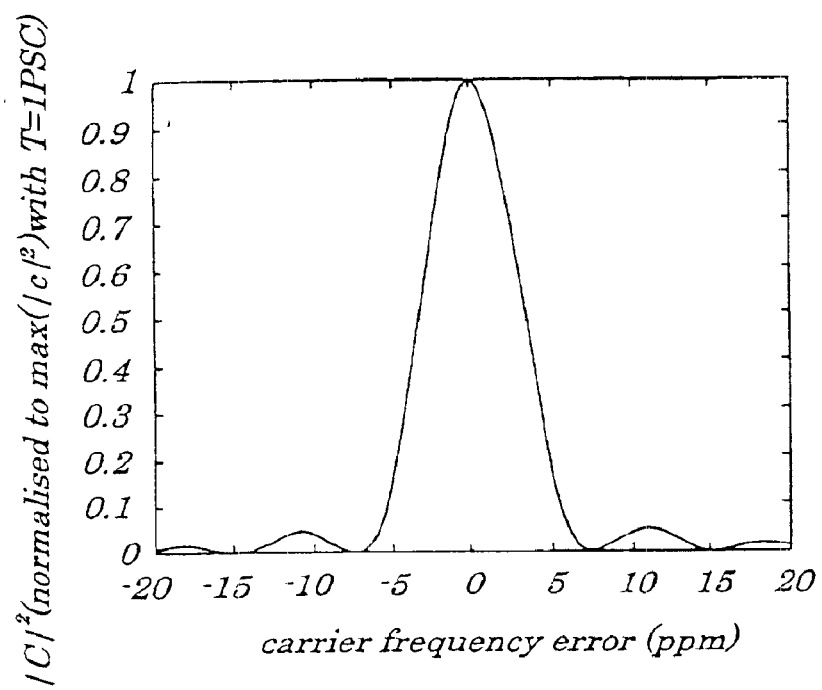
FIG. 3 is a plot of normalized correlation power versus frequency offset.
Figure 4:
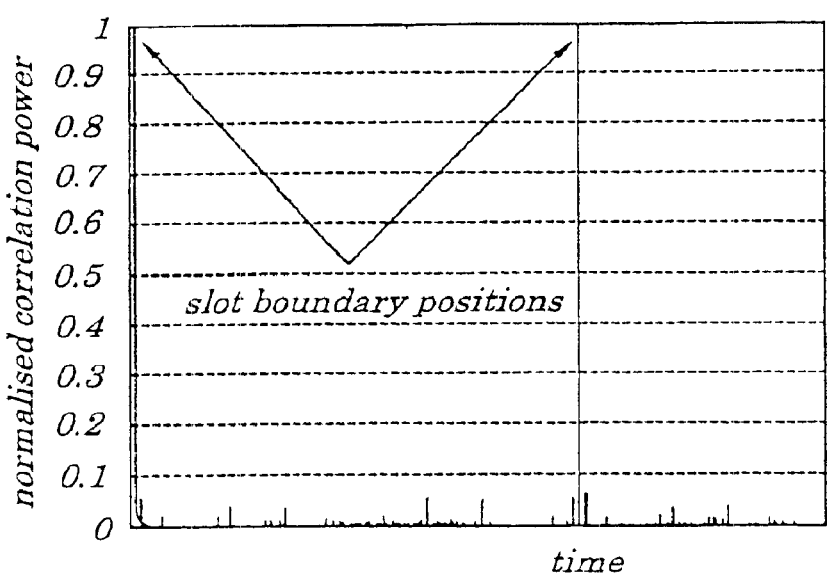
FIG. 4 illustrates the result of a full correlation with no frequency offset.
Figure 5:
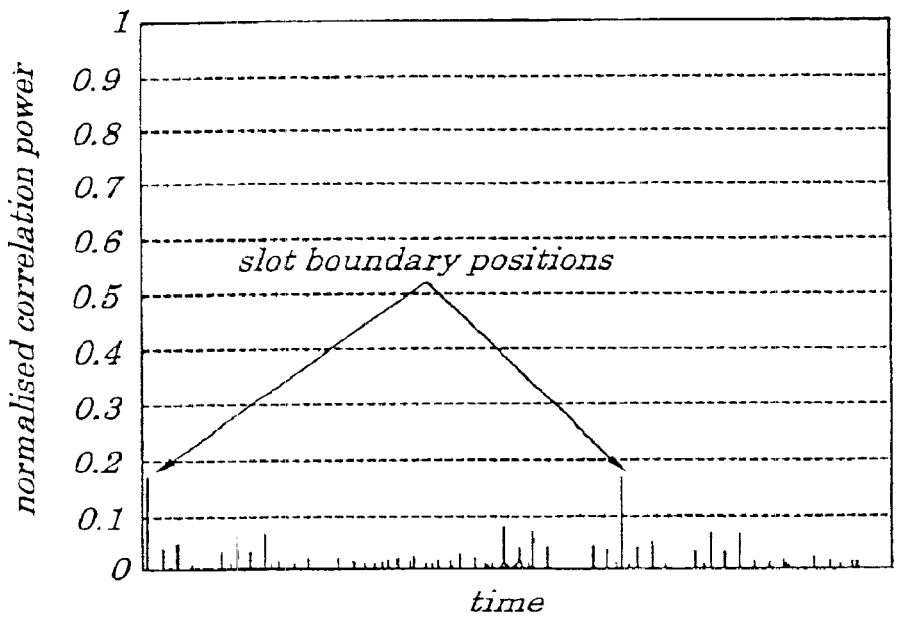
FIG. 5 shows the results from a full correlation at a frequency offset of 5 ppm.
Figure 6:
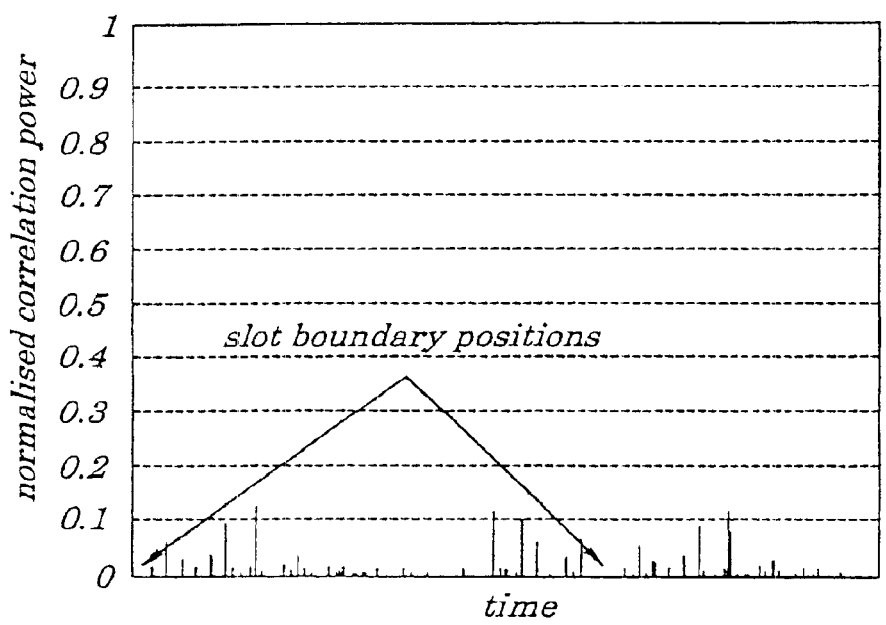
FIG. 6 shows the results from a full correlation at a frequency offset of 7.5 ppm.

The graphical plot of FIG. 3 is derived from equation 7 and shows the value of correlation power versus the carrier frequency offset (in ppm) for correlation periods of 1 PSC (256 chips in FDD mode of UMTS). The plot shows the received signal power as a function of carrier frequency offset. The effect of carrier frequency offset on the received correlation peak power is shown in FIGS. 4, 5 and 6 for a stationary mobile. More specifically, FIG. 4 illustrates the result of a full correlation with no frequency offset, FIG. 5 shows the results from a full correlation at a frequency offset of 5 ppm, and FIG. 6 shows the results from a full correlation at a frequency offset of 7.5 ppm. These plots clearly indicate that for large carrier frequency errors and low signal to noise plus interference ratios, the probability of detection of the slot boundaries reduces.

The size of carrier frequency offset may be estimated by detecting its effect on the correlation between the received PSC signal and the local PSC at the mobile receiver. As it was shown before, the larger values of the carrier frequency offset correspond to smaller values of the correlation power. The correlation process is applied per slot of the received signal and may be averaged to provide a set of average correlation powers by processing a number of received slots.

The largest average power, corresponding to the largest average peak is selected and saved as reference.

Following on from this, the carrier frequency is changed by the addition of a frequency shift, selected from a set of predetermined frequencies under software control. The process of correlation power measurement is then applied to the next set of received signal slots to choose a further average power corresponding to the largest peak is better than the previously stored reference, then the frequency shift is kept and the reference is replaced by the new correlation power.

The application of the same frequency shift is then continued and average power measurement performed for the next set of received signal slots. Again, if the average power of the largest peak is better from the stored reference then that frequency shift is kept and the reference replaced by the new correlation power.

If the application of the frequency shift results in a reduction of the largest correlation power measured compared to the reference, the addition of the last frequency shift is undone and instead a smaller value of the frequency shift is applied to the carrier frequency. The process continues until all of the available shifts have been used. The shift corresponding to the stored reference then becomes the offset to be applied.

The frequency shifts applied decrease in size with each next smaller frequency shift being applied when the application of a larger one resulted in a degradation in power.

Once the iterative frequency correction process is over, the software will activate the UMTS cell search process to enable the mobile to lock-on to a transmitter in a cell.

Figure 7:
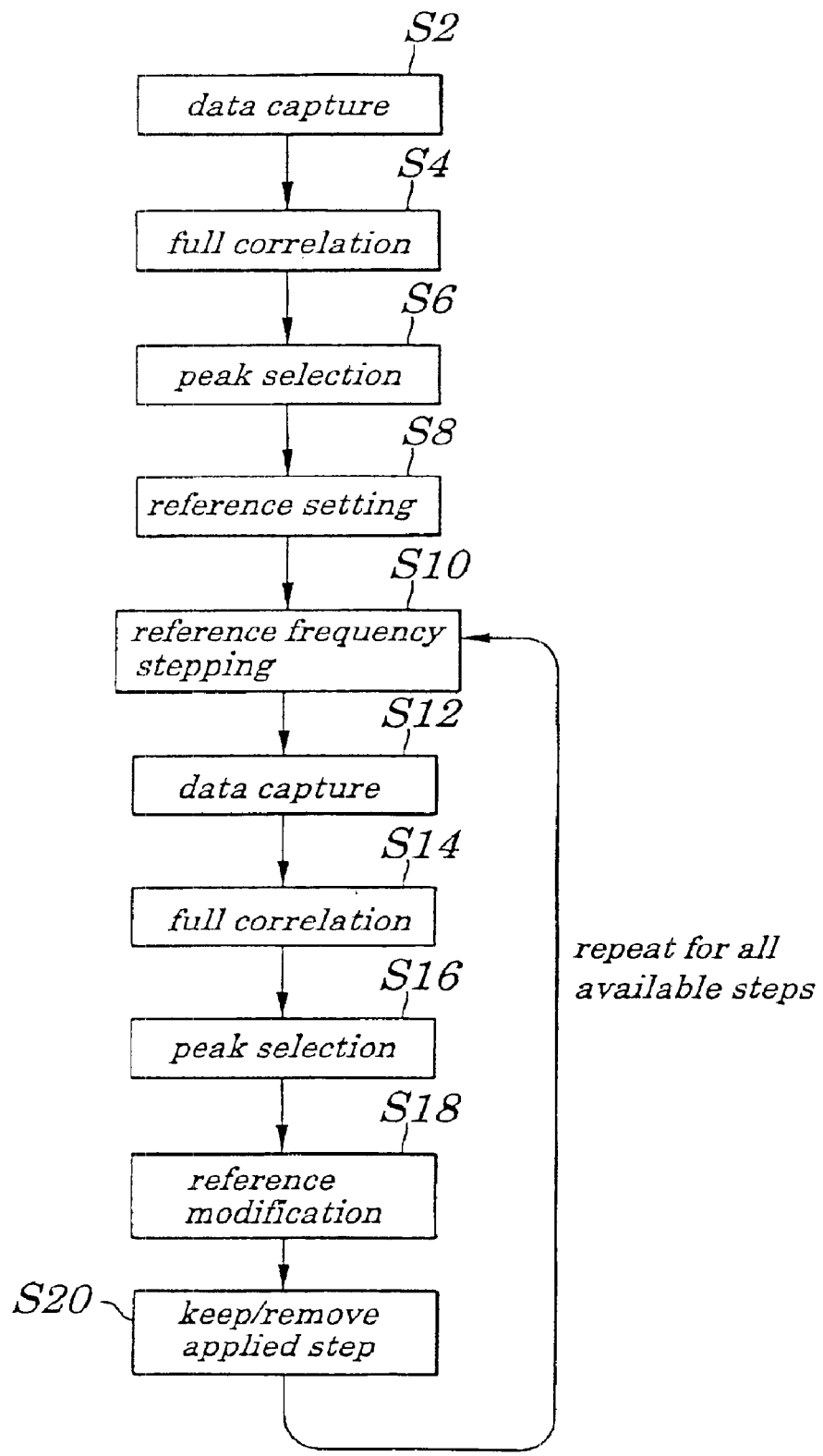
FIG. 7 is a flowchart illustrating the frequency correction process.

A flowchart of the process of iteration is shown in FIG. 7. The first step in this is data capture (in step S2) in which the incoming data from BST1 and BST2 of FIG. 1 is received. After this, a full correlation of the received PCCPCH signal and the local PSC is performed at the mobile receiver (step S4). This may be performed over a number of slots and the results averaged before passing to the peak selection step (step S6) which selects the largest peak.

After peak selection the time position of the largest peak is set as the reference peak in step S8. The iterative progress then begins.

The reference frequency is increased by a predetermined step length (step S10). The step length used depends on the inaccuracy of the reference oscillator and the desired measurement duration. For instance for an inaccuracy of say 5 ppm, 4 steps of −5, −2.5, +2.5 and +5 may be used. If better resolution is needed, the step size may be reduced by increasing the number of steps. It is also possible to use step sizes which are not all a multiple of the minimum step, e.g., −5, −3, +3, and +5. The first reference frequency step is the largest step that will be applied and the other stored possible steps are all smaller. Typically, step length will decrease by 50% successively.

After this, the same process operates again, data capture is performed in step S12, a full correlation performed in step S14, and the peak selected in step S16. Reference modification is applied in step S18 if the new peak is larger than the previous peak and then in step S20 the frequency step applied to the reference frequency in step S16 is either kept removed in dependence on whether or not any improvement to the reference peak was made in step S18.

Figure 8:
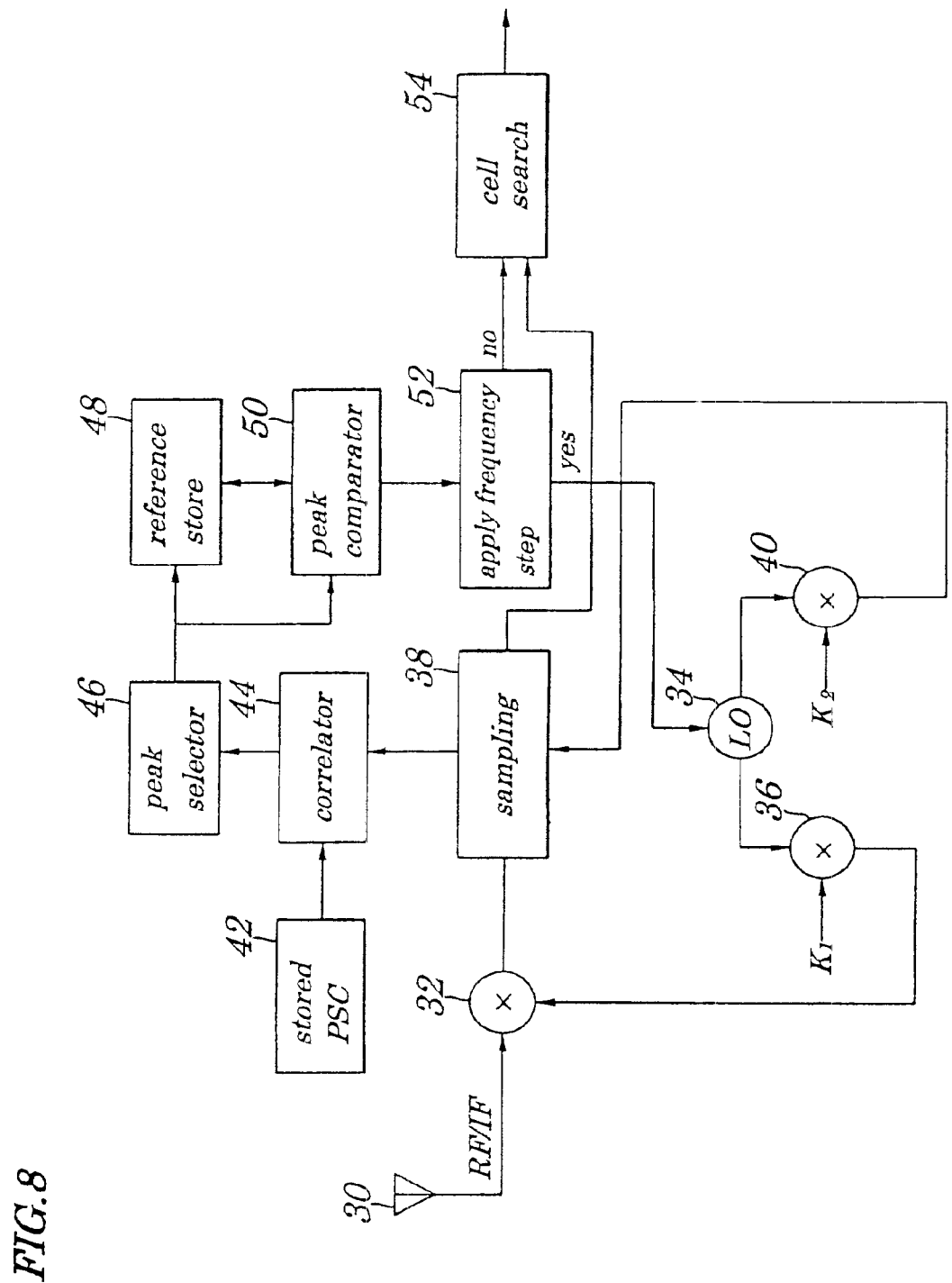
FIG. 8 shows a block diagram of a system for implementing the process of FIG. 7.

A block diagram of a circuit for performing the method of FIG. 7 is shown in FIG. 8. In this, RF/IF signals are received via an antenna 30 which supplied them to a down-converter 32. This down-converts them in dependence on the frequency supplied by a local oscillator 34 multiplied in a multiplier 36 by a constant $K_1$. After down conversion the signals are sampled for data capture in a sampling unit 38. The timing of samples is controlled by a sampling frequency supplied by the local oscillator 34 after multiplication by constant $K_2$ in multiplier 40. After sampling, the sample signals are correlated with a locally stored primary synchronization code PSC from a memory 42 in a correlator 44. This may perform a single correlation or may perform a succession of correlations which are averaged. The results from the correlation are supplied to a peak selector 46 which detects the largest correlation peak. Initially, this is stored in a reference store 48 whose contents are initially empty. This occurs because the peak is also supplied to a peak comparator 50 which compares the size of the peak with the size of any peak stored in the reference store 48 and, if the result of the comparison is that the current peak is larger, it causes the contents of the reference stored to be overwritten with the new peak.

If the peak comparator 50 does cause a new peak to be written in to the reference store 48, a frequency stepping unit 52 then operates to adjust the local oscillator 34. Sampling, correlation, peak selection and peak comparison are then performed again and the reference store updated again if the new peak is larger than the previous peak. This continues with decreasing step sizes applied by the frequency stepper 52 until all frequency steps all frequency steps have been cycled through. When this occurs, the frequency stepper 52 applies a control signal to a cell search unit 54 to continue the process of locking on to a cell base station so that the mobile phone is ready to receive and transmit calls. This further cell search does not form part of the subject matter of the present application.

It is noted that a mobile receiver as described in the above embodiments has a processor (not shown) to control each of components of the mobile receiver in accordance with a specified control program, a ROM (not shown) used to store the specified control program executed by the processor, a RAM (not shown) serving as a working area of the processor or the like.

It is apparent that the present invention is not limited to the above embodiments but may be changed and modified without departing from the scope and spirit of the invention.

What is claimed is:

1. A method for adjusting reference frequency in a receiver wherein received signals include a plurality of sequential slots of data, at least one of which includes synchronization data, said method comprising the steps of:

down-converting received signals using a first frequency derived from a local oscillator;

performing a correlation of said down-converted signal with the locally stored synchronization code;

detecting a peak correlation value from the result of said correlation;

comparing said peak correlation value with the contents of a peak correlation value store; and adjusting said frequency applied to said down-converting in dependence on the results of said comparison, in said adjusting of the frequency, performing further correlations and frequency adjustments with short intervals so long as the previous frequency adjustment results in a larger peak correlation value than is stored in said peak correlation value store, in accordance with the result of the comparison, and removing the last made frequency adjustment if it resulted in a smaller peak correlation value than is stored in said peak correlation value store, in accordance with the result of the comparison.

2. The method for adjusting reference frequency in a receiver according to claim 1 wherein further frequency adjustments with short intervals are performed in response to a peak correlation value being detected which is smaller than is stored in said peak correlation value store after removal of the previous frequency adjustment.

3. An apparatus for adjusting reference frequency in a receiver wherein received signals include a plurality of sequential slots of data, at least one of which includes synchronization data, said apparatus comprising:

down-converting means for down-converting received signals using a first frequency derived from a local oscillator;

correlation performing means for performing a correlation of said down-converted signal with the locally stored synchronization code;

detecting means for detecting a peak correlation value from the result of said correlation;

comparing means for comparing said peak correlation value with the contents of a peak correlation value store; and frequency-adjusting means for adjusting said frequency applied to said down-converting in dependence on the result of said comparison, wherein said frequency-adjusting means performs further correlations and frequency adjustments with short intervals so long as the previous frequency adjustment results in a larger peak correlation value than is stored in said peak correlation value store, in accordance with the result of the comparison, and, said frequency-adjusting means removes the last made frequency-adjustment if it resulted in a smaller peak correlation value than is stored in said peak correlation value store, in accordance with the result of the comparison.

4. The apparatus for adjusting reference frequency in a receiver according to claim 3, wherein said frequency-adjusting means performs further frequency adjustments with shorter intervals in response to a peak correlation value being detected which is smaller than is stored in said peak correlation value store after removal of the previous frequency adjustment.

* * * * *